United States Patent [19]
Heng et al.

[11] Patent Number: 6,083,275
[45] Date of Patent: Jul. 4, 2000

[54] OPTIMIZED PHASE SHIFT DESIGN MIGRATION

[75] Inventors: Fook-Luen Heng, Yorktown Heights; Lars W. Liebmann, Poughquag, both of N.Y.

[73] Assignee: International Business Machines Corporation, Armonk, N.Y.

[21] Appl. No.: 09/005,613

[22] Filed: Jan. 9, 1998

[51] Int. Cl.$^7$ .............................. G06F 7/60; G06F 17/10; G03F 9/00; G03F 5/00
[52] U.S. Cl. ................................ 716/19; 716/21; 430/4; 430/5; 430/8
[58] Field of Search ............................. 395/500.2; 430/5

[56] References Cited

U.S. PATENT DOCUMENTS

| | | | |
|---|---|---|---|
| 5,062,054 | 10/1991 | Kawakami et al. | 364/491 |
| 5,442,714 | 8/1995 | Iguchi | 382/144 |
| 5,537,648 | 7/1996 | Liebmann et al. | |
| 5,636,131 | 6/1997 | Liebmann et al. | 364/490 |
| 5,705,301 | 1/1998 | Garza et al. | 430/5 |
| 5,900,338 | 5/1999 | Garza et al. | 430/5 |
| 5,923,562 | 7/1999 | Liebmann et al. | 364/488 |
| 5,923,566 | 7/1999 | Galan et al. | 364/489 |

OTHER PUBLICATIONS

A.S. Wong et al., Investigating Phase–Shifting Mask Layout Issues using a CAD Toolkit, Electron Devices Meeting, 1991. Technical Digest., International, pp. 705–708, Dec. 1991.

Kazuko Ool, et al., "Method of Designing Phase–Shifting Masks Utilizing a Compactor", Jpn. J. Appl. Phys. vol. 33 (1994) Pt. 1, No 12B, pp. 6774–6778.

Fook–Luen Heng et al., "A VLSI Artwork Legalization Technique Based on a New Criterion of Minimum Layout Perturbation", ISPD, 1997, pp. 116–121.

Marc D. Levenson, "Phase–Shifting Mask Strategies: Isolated Dark Lines", Microlithography World Mar./Apr. 1992, pp. 6–12.

Gerald Galan et al. "Phase Shifted Design Verification Routine", S/N 08/823576, Mar. 25, 1997.

Lars W. Liebmann et al., "Phase Shifted Mask Design System, Phase Shifted Mask and VLSI Circuit Devices Manufactured Therewith", S/N 08/824700, Apr. 14, 1997.

Y.Z. Liao et al. "An Algorithm to Compact a VLSI Symbolic Layout with Mixed Constraints", Proc. 20th Design Automation conference, Jun. 1983, pp. 107–112.

*Primary Examiner*—Paul R. Lintz
*Assistant Examiner*—A. M. Thompson
*Attorney, Agent, or Firm*—Ratner & Prestia; H. Daniel Schnurmann

[57] ABSTRACT

A method for converting an integrated circuit design to a phase-shift complaint mask design. The method comprises the steps of locating features of the integrated circuit that violate predetermined design criteria converting error flags to physical marker shapes, modifying the located features using layout modification system technology based on a predetermined cost constraint, determining if all violations are corrected, and either changing the cost constraint to a higher cost constraint if violations still exist and repeating the process or terminating the conversion if all violations are corrected.

20 Claims, 16 Drawing Sheets

OPTIMIZED PHASE SHIFT DESIGN MIGRATION

FIELD OF THE INVENTION

The present invention generally relates to the manufacture of very large scale integrated (VLSI) circuits and, more particularly, to the enhancement of photolithographic images through the use of phase shifted masks. Even more specifically, a process is provided to optimize the conversion of an existing design to a phase shift compliant design.

BACKGROUND OF THE INVENTION

A very large scale integrated (VLSI) complementary metal oxide semiconductor (CMOS) chip is typically manufactured on a silicon wafer by a sequence of material additions (i.e., low pressure chemical vapor depositions, sputtering operations, etc.), material removals (i.e., wet etches, reactive ion etches, etc.) and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations must be confined to small, well-defined regions.

Lithography in the context of VLSI manufacturing of CMOS devices is the process of patterning openings in photosensitive polymers (sometimes referred to as photoresists or resists) which define small areas in which the silicon base material is modified by a specific operation in a sequence of processing steps. The manufacturing of CMOS chips involves the repeated patterning of photoresist, followed by an etch, implant, deposition, or other operation, and ending with the removal of the expended photoresist to allow new resist to be applied for further iterations of the process sequence.

A conventional lithography system consists of a light source, a stencil or photomask containing the pattern to be transferred to the wafer, a collection of lenses, and mechanism for aligning existing patterns on the wafer with patterns on the mask. Because a wafer (typically containing from fifty to one hundred chips) is patterned in steps of one to four chips at a time, these lithography tools are commonly called steppers. The resolution, R, of an optical projection system such as a lithography stepper is limited by parameters described in Raleigh's equation:

$$R = k \frac{\lambda}{NA} \quad \text{(Equation 1)}$$

where λ is the wavelength of the light source used in the projection system, NA is the numerical aperture of the projection optics used, and k is a factor describing how well a combined lithography system can use the theoretical resolution limit in practice. The factor k can range from 0.8 down to 0.5 for standard exposure systems.

The highest resolution in optical lithography is currently achieved with deep ultra violet (DUV) steppers operating at a wavelength of 248 nm. Alternately, mid ultra violet (MUV) steppers with a wavelength of 356 nm are also available.

FIG. 1A shows a side view of a conventional photomask 100. Referring to FIG. 1A, photomask 100 consists of chromium patterns 102 on quartz plate 104, allowing light to pass wherever the chromium has been removed from photomask 100, such as area 106. Light of a specific wavelength is projected through the mask on the photoresist coated wafer (not shown), exposing the resist wherever hole patterns are placed on the mask. Exposing the resist to light of the appropriate wavelength causes modifications in the molecular structure of the resist polymers which allows developer to dissolve and remove the resist in the exposed areas. (Negative resist systems allow only unexposed resist to be developed away.) The photomask, when illuminated, can be pictured as an array of individual, infinitely small light sources which can be turned on (clear areas 106) or off (chrome areas 102). As shown in FIG. 1B, if the amplitude of the electric field vector, which describes the light radiated by these individual light sources, is mapped across a cross section of the photomask 100, a step function 110 will be plotted reflecting the two possible states that each point on the mask can be found (light on, light off).

These conventional photomasks are commonly called chrome-on-glass (COG) binary masks, due to the binary nature of the image amplitude. The perfectly square step function 110 exists only in the theoretical limit of the exact mask plane. As shown in FIG. 1C, at any distance away from the mask, such as at the wafer plane 120, diffraction effects will cause images to exhibit a finite image slope 122. At small dimensions, such as when the size and spacing of the images to be printed are small relative to the λ/NA, electric field vectors of adjacent images 124, 126, 128 interact and add constructively. As shown in FIG. 1D, the resulting light intensity curve 130 between the features is not completely dark, but exhibits a significant amount of light intensity, created by the interaction of adjacent features. This results in minimal definition 132 between adjacent features. The resolution of an exposure system is limited by the contrast of the projected image, that is, the intensity difference between adjacent light and dark features. An increase in the light intensity in nominally dark regions will eventually cause adjacent features to print as one combined structure rather than as discrete images.

The quality with which small images can be replicated in lithography depends largely on the available process latitude: the amount of allowable dose and focus variation that still results in correct image size. Phase-shift mask (PSM) lithography improves the lithographic process latitude or allows operation of a lower k value (see Equation 1) by introducing a third parameter on the mask. The electric field vector, like any vector quantity, has a magnitude and direction, so in addition to turning the electric field amplitude on and off, it can be turned on with a 0 degree phase or turned on with a 180 degree phase, for example.

Referring to FIG. 2A, this phase variation is achieved in PSMs by modifying the length 202, 204 that light beam 206, 208 travels through the mask material 200, in areas 205, 207, respectively. By recessing the mask to an appropriate depth 210, light 208 traversing the thinner area 207 of the mask and light 206 traversing the thicker area 205 of the mask will be 180 degrees out of phase: their electric vectors will be of equal magnitude but point in exactly opposite directions so that any interaction between these light beams results in perfect cancellation. This result is shown in FIG. 2B, where the summation of light beams 206 and 208 before and after passing through mask 200 are indicated as light beams 212 and 214, respectively. Marc D. Levenson, in "Phase-Shifting Mask Strategies: Isolated Dark Lines", Microlithography World, pp. 6–12 March/April 1992, provides additional information on PSMs.

Phase-edge PSM lithography uses contrast enhancement caused by phase transition across an opaque feature on a mask. This phase transition is achieved by creating an appropriate (0.5+λ)/(1-refractive index) pathlength difference between light traversing the mask on opposite sides of a critical dimension feature. The pathlength difference can be accomplished by selectively subtracting or depositing material on either or both sides of the critical dimension feature.

Referring to FIGS. 3A–3D, a typical PSM photomask is shown. In FIG. 3A, photomask 300 has chromium deposits 302 on a surface of quartz plate 304. Clear areas 306 are of varying depth to create an out of phase condition. FIG. 3B shows the resulting step function 310. FIG. 3C shows that, although the electric fields have defined slopes 322, 324, 326 for each section of photomask 300, adjacent slopes such as 322, 324, and 326 are out of phase. As shown in FIG. 3D, the resulting light intensity curve 330 has increased definition 332 between adjacent features.

FIGS. 4A–4D show two types of PSM photomasks. FIGS. 4A and 4B show a 0°/180° process PSM photomask and FIGS. 4C and 4D show a 90°/270° process PSM photomask.

In FIG. 4A photomask 400 has chromium deposits 402 on a surface of quartz plate 404. Clear areas 406 and 408 are phased at 0° and 180°, respectively. This results in a phase shift on only one side of a feature. FIG. 4B is a cross-section of photomask 400 taken along section line 4B—4B.

In FIG. 4C, photomask 400 also has chromium deposits 402 on a surface of quartz plate 404. Clear areas 410 and 412 are phased at 90° and 270°, respectively. In addition, clear area 414 is phased at 0°. This results in a phase shift on both sides of a feature. FIG. 4D is a cross-section of photomask 400 taken along section line 4D—4D.

Independent of the specific implementation of the phase-edge PSM technique, existing circuit designs must be modified to provide design shapes reflecting the desired topography modifications on the mask. This design modification process depends on automated computer-aided design (CAD) tools to efficiently and accurately convert large hierarchical data sets to include the phase-edge PSM topography designs. It is well known to those skilled in the art that, independent of the specific PSM implementation and the specific CAD tool, it is not possible to convert all circuit designs to PSM layout data.

Such a CAD-based PSM design tool is disclosed in U.S. Pat. No. 5,537,648 issued on Jul. 16, 1996 to Liebmann et al. This tool is unable to guarantee that any arbitrary chip design can be converted to a PSM design without violations between phases.

Another approach for converting conventional VLSI designs to phase-shift compliant designs is illustrated by Kazuko Ooi et al., in "Method of Designing Phase-Shifting Masks Utilizing a Compactor", Jpn. J. Appl. Phys., Vol. 33, pp. 6774–6778 (1994). This approach assigns colors to neighboring shapes and uses a layout modification system to place shapes based on a simple, single-spacing rule for shapes of opposite color. The drawback of this approach is that it is restricted to one type of PSM design.

Design conflicts also arise from shapes that cannot be consistently converted to a PSM design. A typical example of such a shape is a "T". Furthermore, layouts that are driven by physical size requirements for the individual phase regions may violate spacing requirements.

Extensive and complex design rules need to be imposed on circuit designers to ensure that a resulting design can be converted to a PSM layout. Several problems arise from these PSM specific design rules:

1. Designs cannot be migrated from a technology generic layout to a process specific design without major manual intervention.
2. The design rules targeting the prevention of specific PSM conflicts are complex and difficult to communicate to designers.
3. Generic extractions of the PSM-specific rules that are easier to communicate, have a prohibitively large layout density impact on chip designs
4. Without appropriate CAD tools it is difficult to quantify the density impact of certain design rules without actually implementing the design changes.

In many cases, a single design conflict can be resolved in multiple fashions, such as either separating two features to accommodate the phase shapes or expanding (widening) one or both conflicting features to eliminate the need for phase shifting. Any manipulation to the design level targeted for the phase-shift conversion has potential impacts on designs on a large number of other design levels. Although the layout modification system-based design manipulation approach correctly manipulates all affected design shapes, it is further necessary to select the best solution to the design conflict.

Constraint-based layout compaction techniques have been used to legalize conventional VLSI designs. Y. Z. Liao and C. K. Wong, An Algorithm to Compact a VLSI Symbolic Layout with Mixed Constraints", Proc. 20th Design Automation Conference, June 1983, pp. 107–112. This approach translates separation required by design ground rules between two layout elements, such as edges of shapes, vias, transistors, etc., into a linear constraint. The system of linear constraints is then solved by using an objective function such as a minimum design area.

More recently, a more general constraint-based layout modification technique using minimum perturbation criteria has been proposed for the purpose of design migration. Fook-Luen Heng et al., "A VLSI Artwork Legalization Technique Based on a New Criterion of Minimum Layout Perturbation", ISPD, 1997, pgs. 116–121. This approach uses the same system of linear constraints to represent the separation between layout elements in order to represent the layout but uses the minimum perturbation criteria in its objective function. These constraint-based layout modification systems can be used to convert conventional migration VLSI designs from one process technology to another. These constraint-based layout modification systems cannot be used, however, to migrate conventional VLSI designs to PSM complaint designs due to the complex shape interactions in a PSM photomask.

PSM conflicts cannot be detected easily using current constraint generation techniques. These techniques only create constraints for simple interaction between layout elements. For example, generating constraints which represent a "T" junction in a PSM photomask is not done in the constraint generation phase of the current constraint-based layout modification system. This implies a method to recognize the "T" junction which is not present in the constraint generation process of conventional constraint-based systems. In addition, the objective functions of the conventional constraint-based systems do not provide fine cost controls to resolve PSM conflicts.

FIGS. 5A–5H illustrate a simple layout that can not be converted to a phase shifted design and various corrective approaches. Referring to FIG. 5A, a portion of an integrated circuit layout 500 to be converted to a PSM-compliant layout is shown. Layout 500 consists of gate levels 502, 504, 506, for example.

Referring to FIG. 5B, an exemplary phase-shift design solution is shown. The photomask 510 used to create gate levels 502, 504, 506 may be initially designed by assigning phases to areas 512, 514, 516 adjacent to each gate level area 502, 504, 506. For example, the phase of area 512 may be 90°. This results in area 514, which is opposite area 512 and adjacent gate level 502, having an opposite phase assigned. Because the phase of area 512 is 90°, the phase of area 514 is 270°. Following this approach, area 516 is then assigned a 90° phase. This results in a conflict in area 514 where area 514 is adjacent to both sides of gate level 504.

FIG. 5C illustrates an exemplary approach to correct the design conflict. In FIG. 5C, the distance 520 between gate level 502 and 504 is increased. As shown in FIG. 5D, this eliminates the conflict by creating areas 514A, 514B, and 514C from area 514. Areas 514A and 514B are on opposite sides of gate level 504 and may now be assigned opposite phases, such as 270° and 90°, respectively. Area 514C is opposite area 512 and as such is assigned a phase opposite to the phase of area 512. As a result, each gate level 502, 504, 506 is defined by areas 512, 514A, 514B, 514C, 516 where a 180° phase shift is realized across each gate level.

Referring to FIG. 5E, a second exemplary approach to the conflict of FIG. 5B is illustrated. In FIG. 5E, a width 525 of a portion of gate level 506 is increased. The mask features which accomplish this solution are shown in FIG. 5F. In FIG. 5F, area 514 of FIG. 5B is divided into areas 514D and 514E each having opposite phases to one another. In addition, area 516 of FIG. 5B is divided into areas 516A and 516B each having opposite phases to one another and to areas 514E and 514D, respectively. This results in a proper phase-shift compliant photomask design.

Referring to FIG. 5G, a third exemplary approach to the conflict of FIG. 5B is illustrated. In FIG. 5, a width 530 of a portion of gate level 502 is increased. The mask features which accomplish this solution are shown in FIG. 5H. In FIG. 5H, area 514 of FIG. 5B is divided into areas 514A and 514B, as shown in FIG. 5D, each having opposite phases. In addition, area 512 of FIG. 5B is divided into areas 512A and 512B each having phases opposite to one another and to areas 514B and 514A, respectively. This results in a proper phase-shift compliant photomask design.

Identifying the best solution out of this multitude of possibilities by manually manipulating the design is virtually impossible for complex IC layouts. In view of the shortcomings of the prior art, it is an object of the present invention to provide a method for design migration to phase-shift compliant integrated circuit designs.

It is a further object of the invention to provide a method for automatically finding the best design solution.

It is another object of the invention to provide a method in which complex PSM conflicts are provided to the constraint-based layout modification system and the conflicts are resolved by a controlled modification using a cost-assignment sequence. Marker shapes may be used to communicate PSM conflicts to the layout modification system in the description of the invention. Other means to communicate the PSM conflicts may include a more sophisticated constraint generation process.

SUMMARY OF THE INVENTION

This and other objects will become apparent during the course of the following description and by reference to the accompanying drawings.

The present invention relates to a process for converting an integrated circuit design to a phase-shift complaint mask design. The process comprises the steps of locating features of the integrated circuit that violate predetermined design criteria, and modifying the violations based on a predetermined cost constraint using the layout modification system. The process is continued until all violations are corrected or until the cost constraint exceeds a predetermined upper limit for the design.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION OF THE INVENTION

The exemplary phase-shift migration (PSM) tool of the present invention uses phase shift specific design rule checking and layout modification system technology to isolate and resolve phase shift in complaint shapes and layouts with minimized impact on layout density. Conceptually, the PSM tool incorporates known design rule checking techniques to locate shapes of layouts that violate phase specific design rules or novel phase shift specific design rule checking as disclosed in co-pending U.S. application Ser. No. 08/823, 576 now U.S. Pat. No. 5,293,566, filed on Mar. 25, 1997. These techniques identify problematic shapes and layouts. Design shapes (marker shapes) are then generated to mark the conflict spots and their area of influence. In other words, the marker shapes highlight the location of a conflict as well as the spatial extent of the conflict. The layout modification system-based design manipulation tool then resolves the design conflicts over the area of influence by selectively expanding the marked portions of the designed features or by moving design features apart in the proximity of a marker shape.

Marker shapes can consist of, for example:

a. Error vectors created by advanced Design Rule Checking (DRC) tools for violations of phase shiftability design rules in the original design level.

b. Error vectors created by a phase-shift design routine based on phase conflicts.

c. Error vectors created by a DRC routine based on design violations in the phase shapes created by the phase-shift design routine.

The marker shapes may be designed to highlight the location of a conflict as well as the spatial extent of the conflict.

Another exemplary solution is to assign a cost to each design manipulation. Manipulations that do not significantly affect the layout density or circuit performance are given a low cost while others are given higher costs to reflect the more serious impact these manipulations have on the overall layout.

An exemplary cost-assignment sequence for design manipulation is:

a. Expand marker shapes (and abutting edges of original levels) only.

b. Move and/or expand marker shapes (and abutting edges of original levels) only without increasing the size of the layout.

c. Move and/or expand marker shapes (and abutting edges of original levels) and affected predefined non-critical levels without increasing the size of the layout.

d. Move and/or expand marker shapes (and abutting edges of original levels) and affected predefined non-critical levels without increasing the size of the layout more than a predetermined percentage.

Figure 1A:
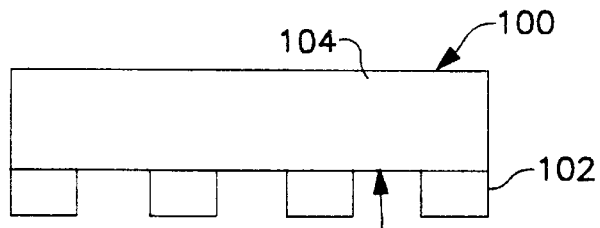
FIG. 1A is a side view of a conventional photomask.
Figure 1B:
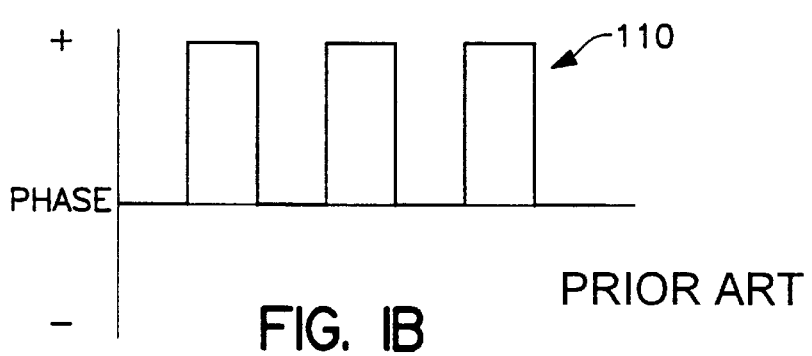
FIG. 1B is an electric field of the mask of FIG. 1A.
Figure 1C:
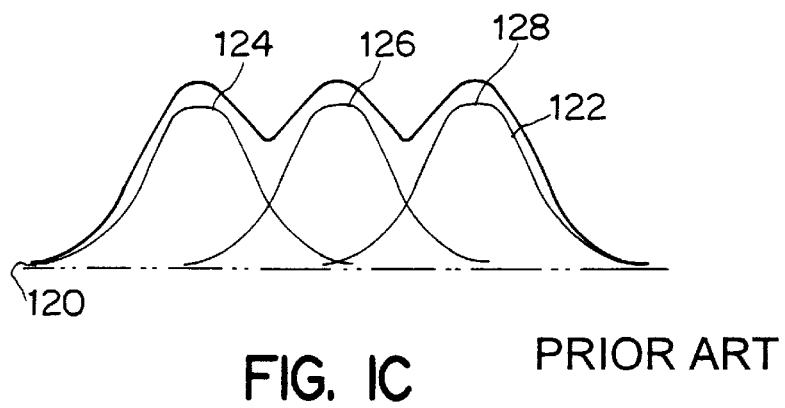
FIGS. 1C and 1D are light intensity waveforms of the mask of FIG. 1A.
Figure 1D:
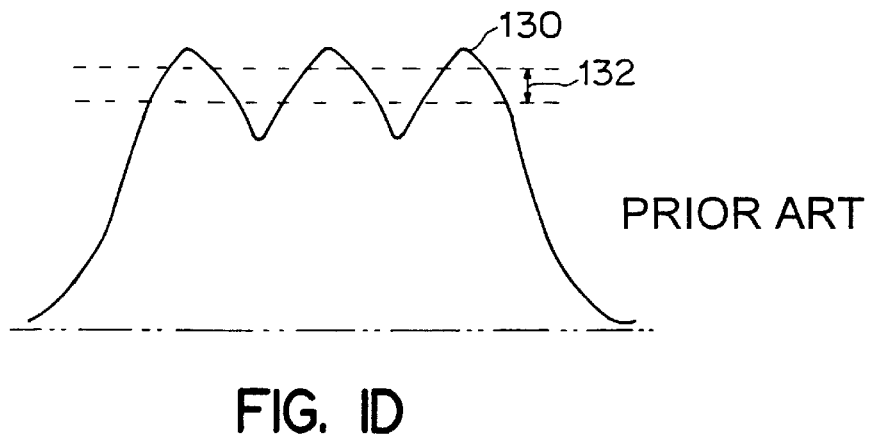
Figure 2A:
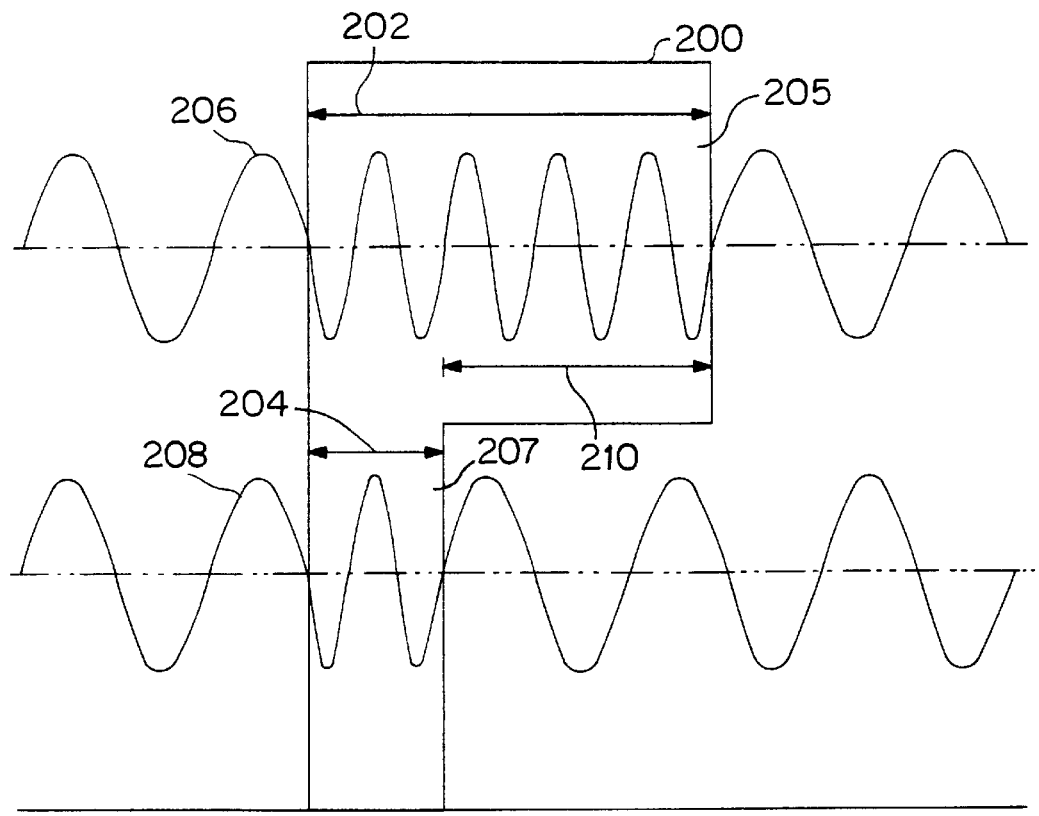
FIGS. 2A and 2B show waveforms of light traversing a phase-shift photomask.
Figure 2B:
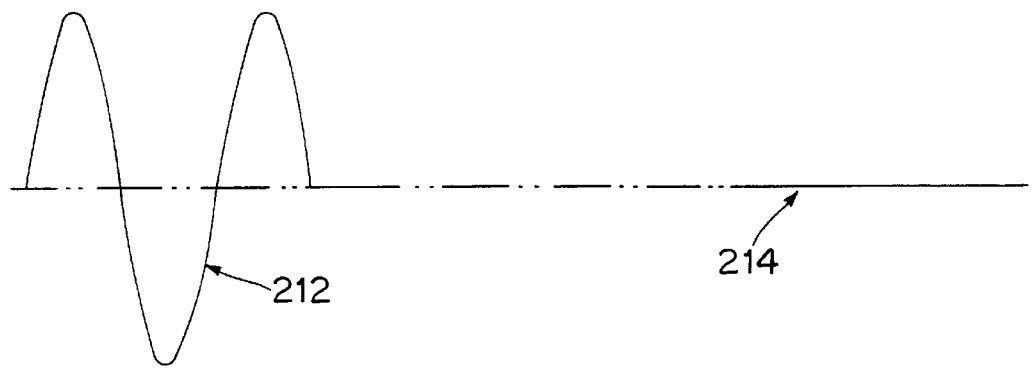
Figure 3A:
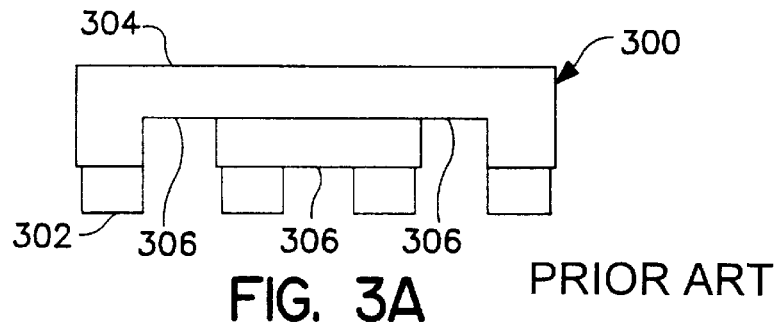
FIG. 3A is a side view of a phase-shift photomask.
Figure 3B:
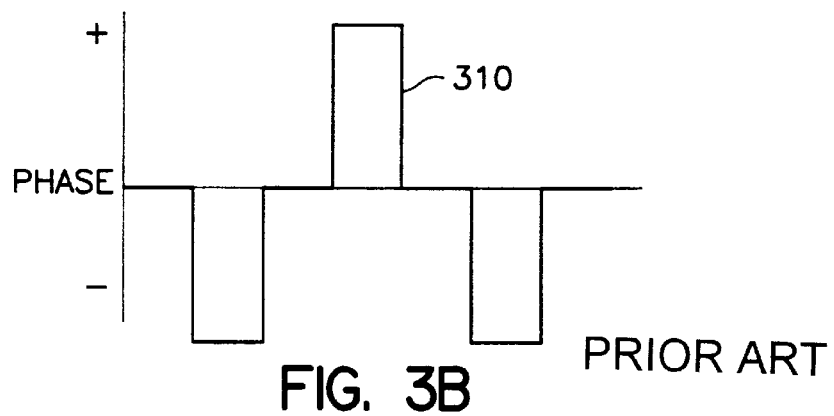
FIG. 3B is an electric field of the mask of FIG. 3A.
Figure 3C:
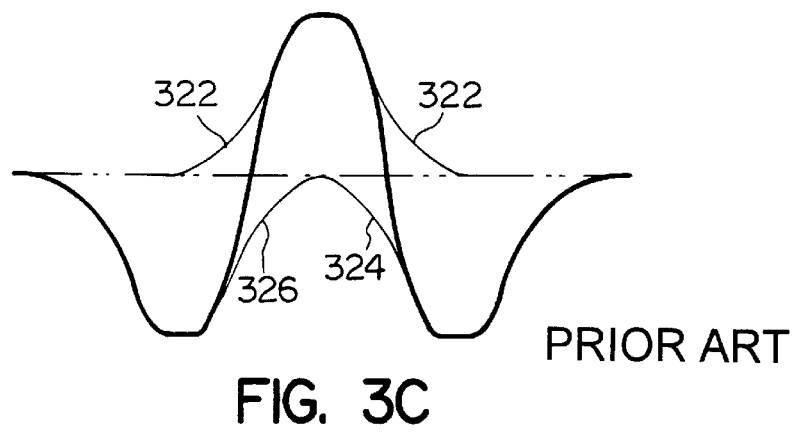
FIGS. 3C and 3D are light intensity waveforms of the mask of FIG. 3A.
Figure 3D:
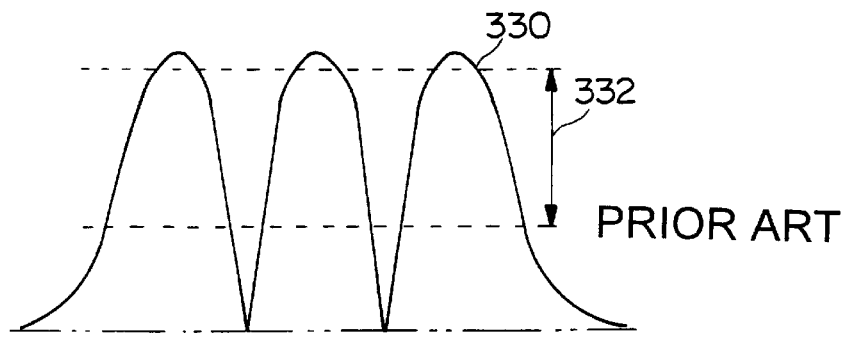
Figure 4A:
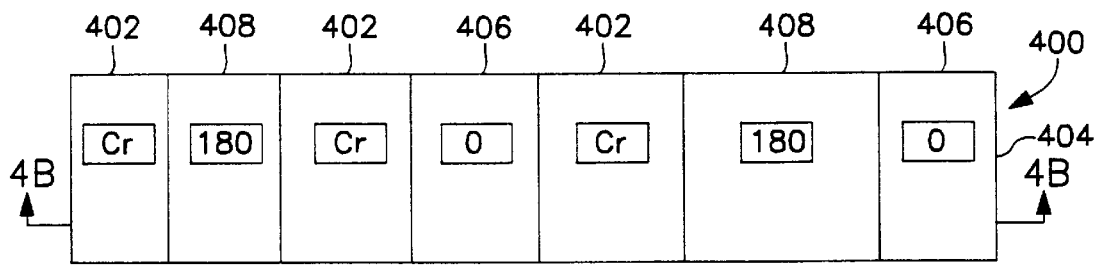
FIG. 4A is a plan view of a 0°/180° phase-shift photomask.
Figure 4B:
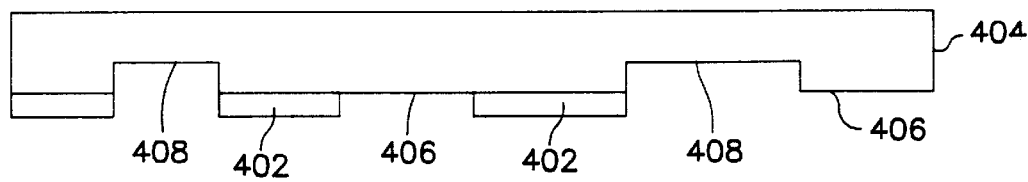
FIG. 4B is a cross-sectional view of FIG. 4A taken along the line 4B—4B.
Figure 4C:
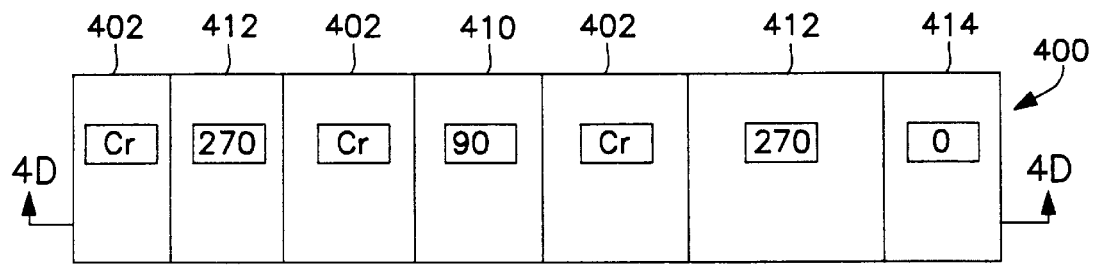
FIG. 4C is a plan view of a 90°/270° phase-shift photomask.
Figure 4D:
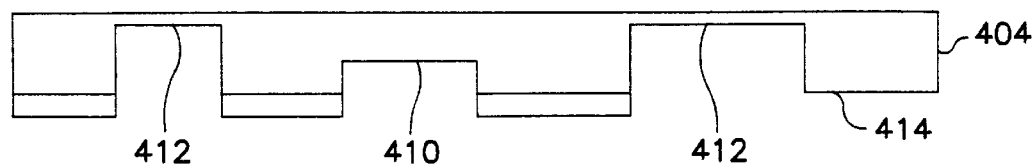
FIG. 4D is a cross-sectional view of FIG. 4C taken along the line 4D—4D.
Figure 5A:
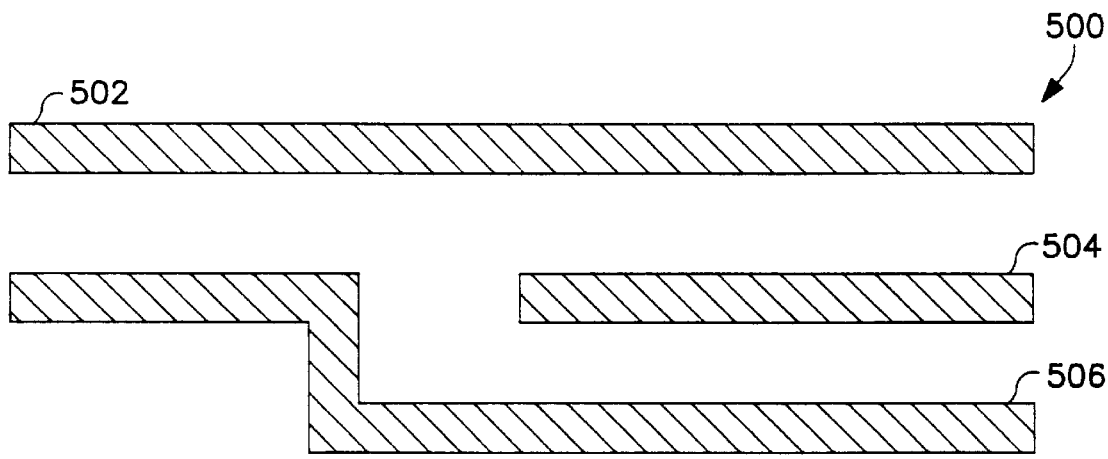
FIGS. 5A–5H show plan views of a partial VLSI circuit layout demonstrating various options for correcting a common design rule violation.
Figure 5B:
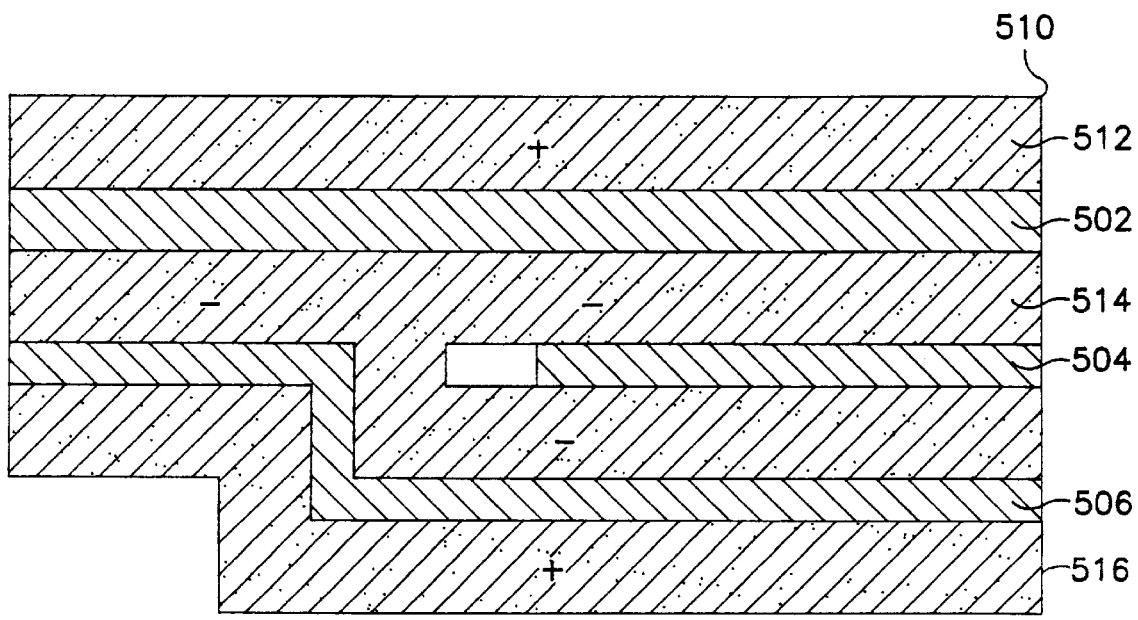
Figure 5C:
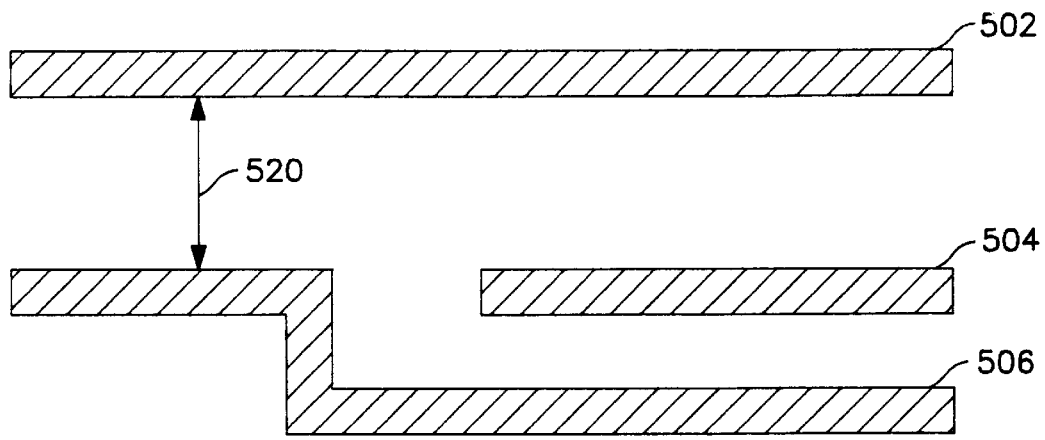
Figure 5D:
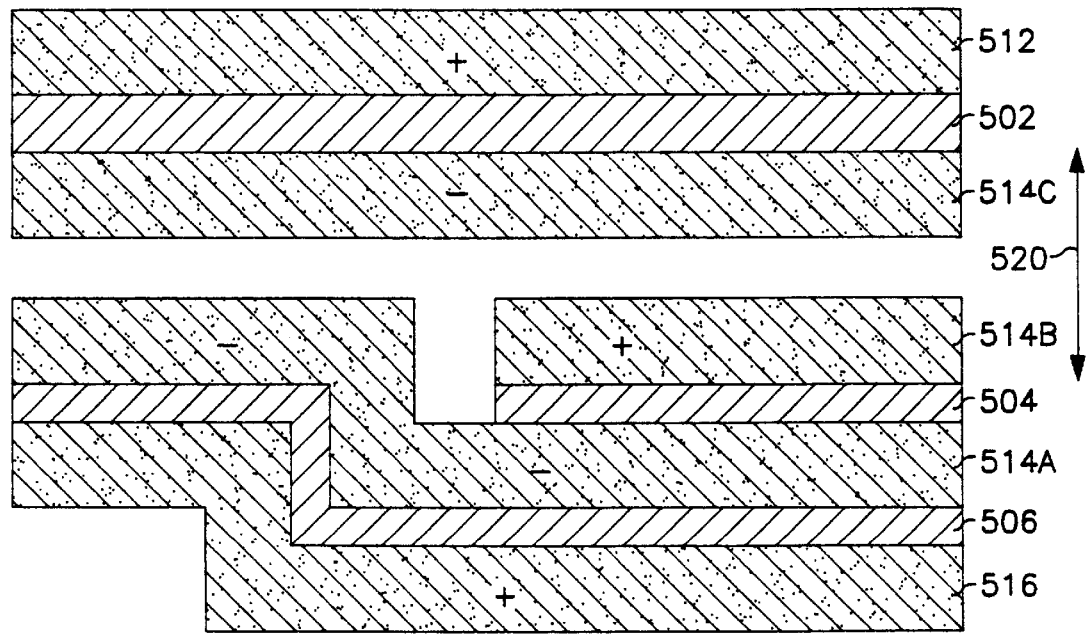
Figure 5E:
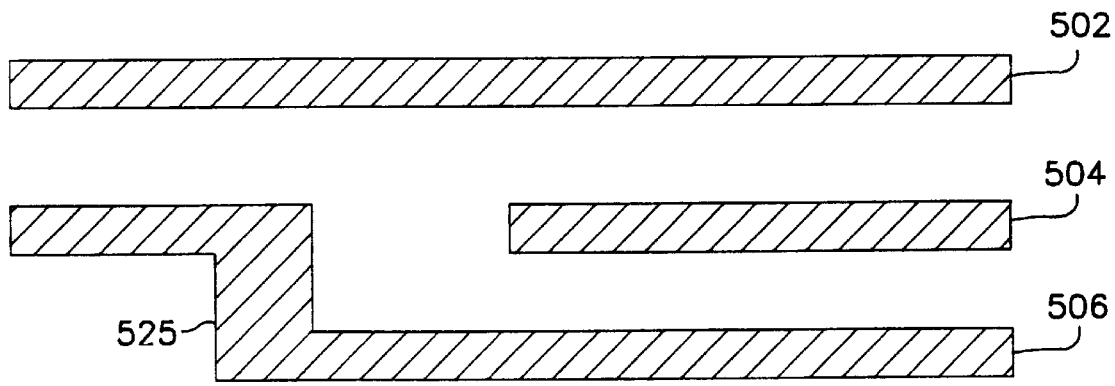
Figure 5F:
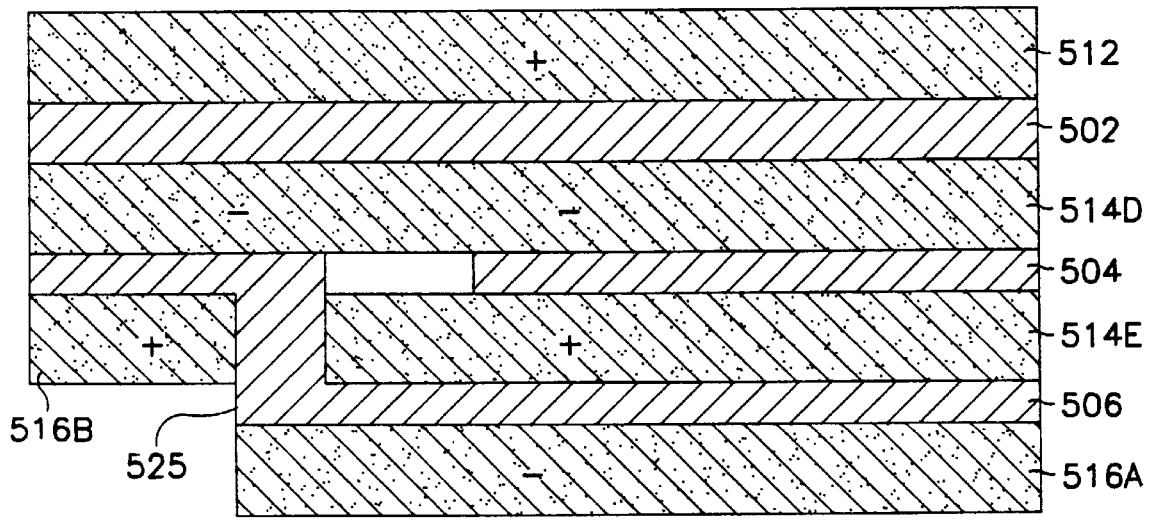
Figure 5G:
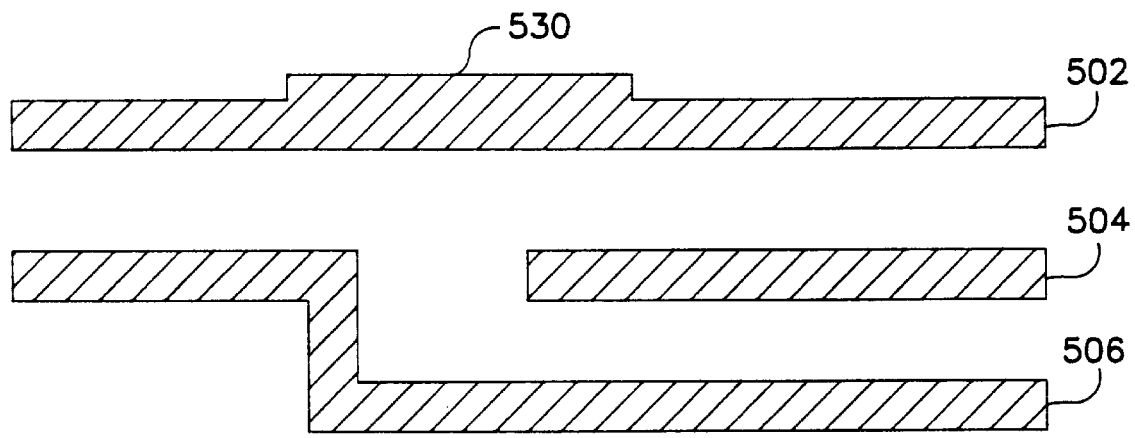
Figure 5H:
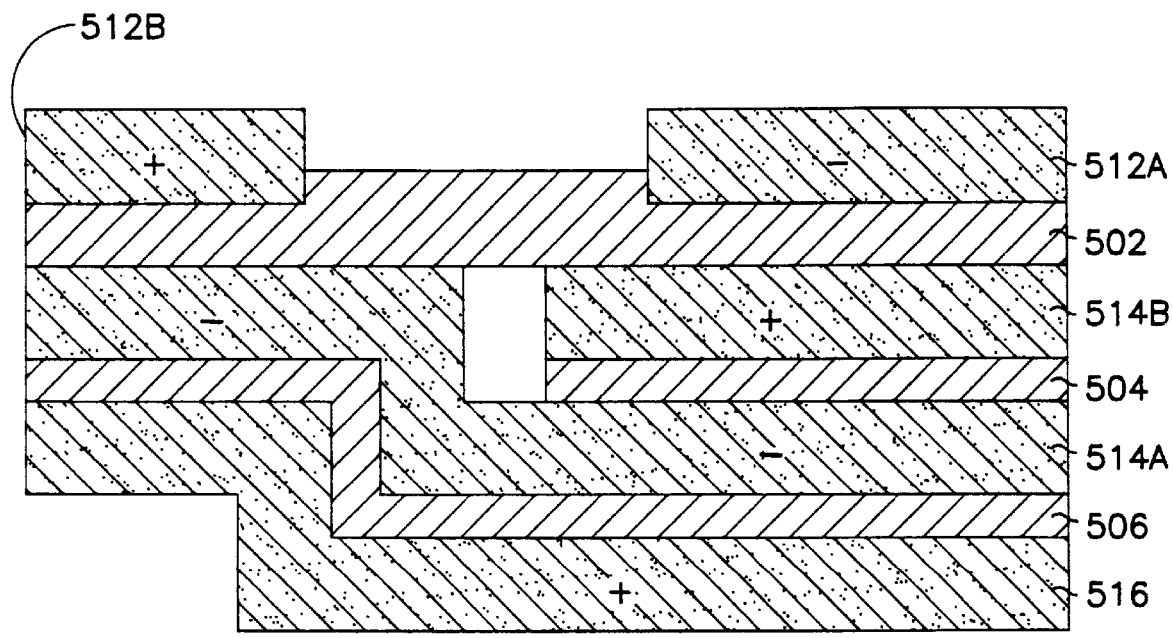
Figure 6A:
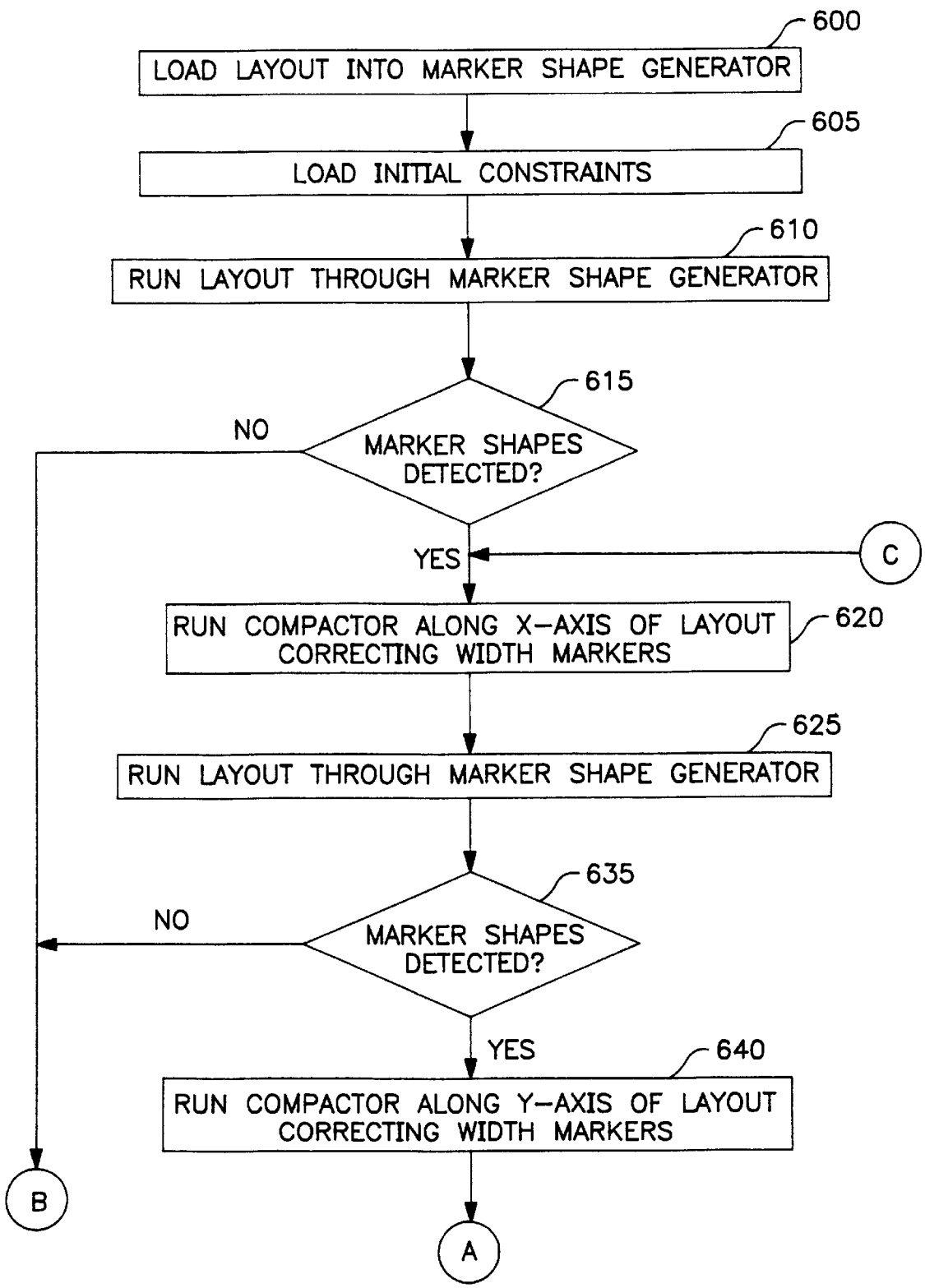
FIGS. 6A and 6B show various process steps of an exemplary embodiment of the present invention.
Figure 6B:
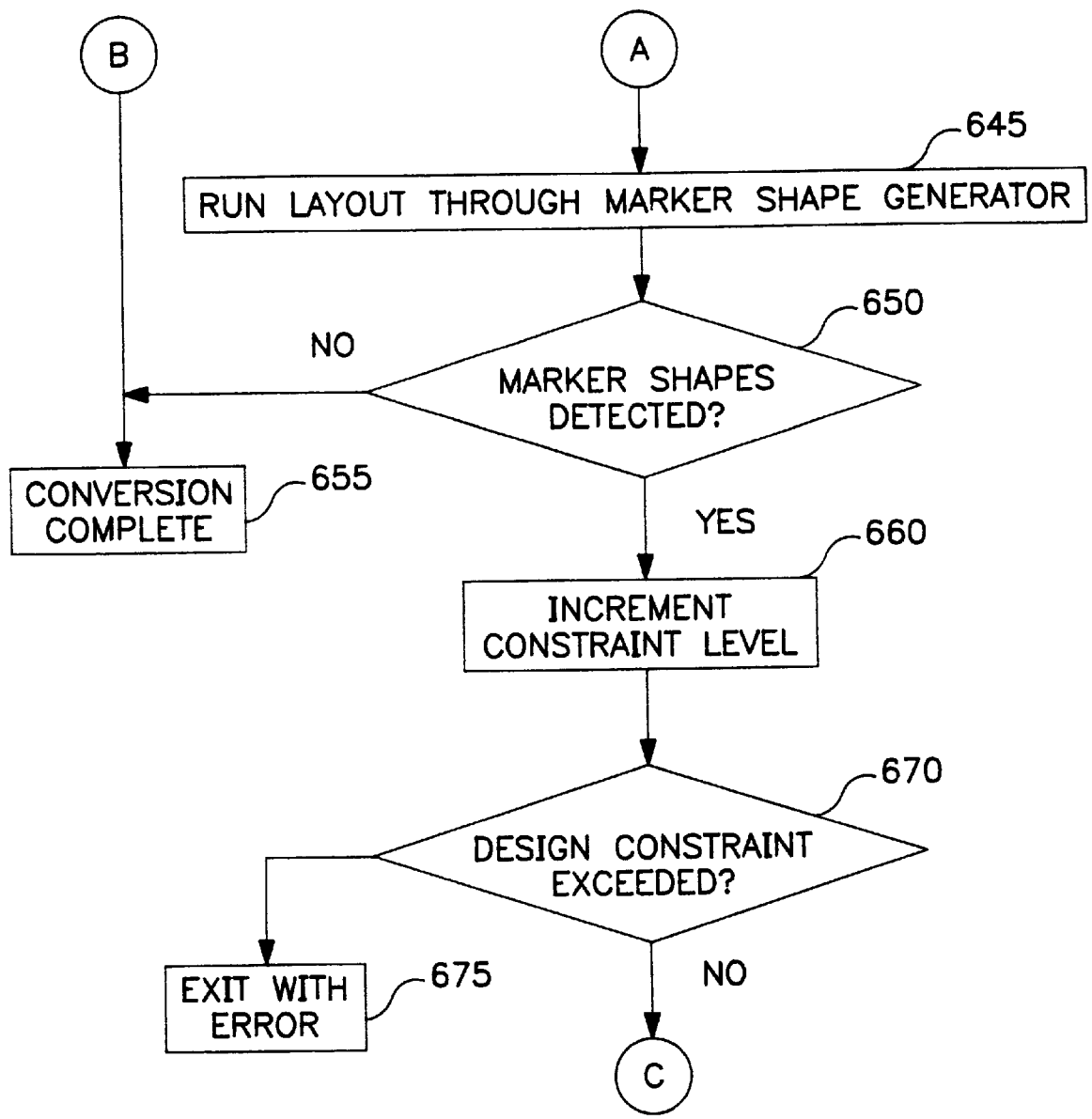

FIGS. 6A–6B constitute a flow chart diagram of an exemplary, optimized, phase-shift compatible design migration of the present invention. This embodiment uses a process to determine design rule violations and to correct for the violations based on predetermined cost constraints. The process shown in FIGS. 6A–6C is described below in conjunction with FIGS. 7A–7G.

Figure 7A:
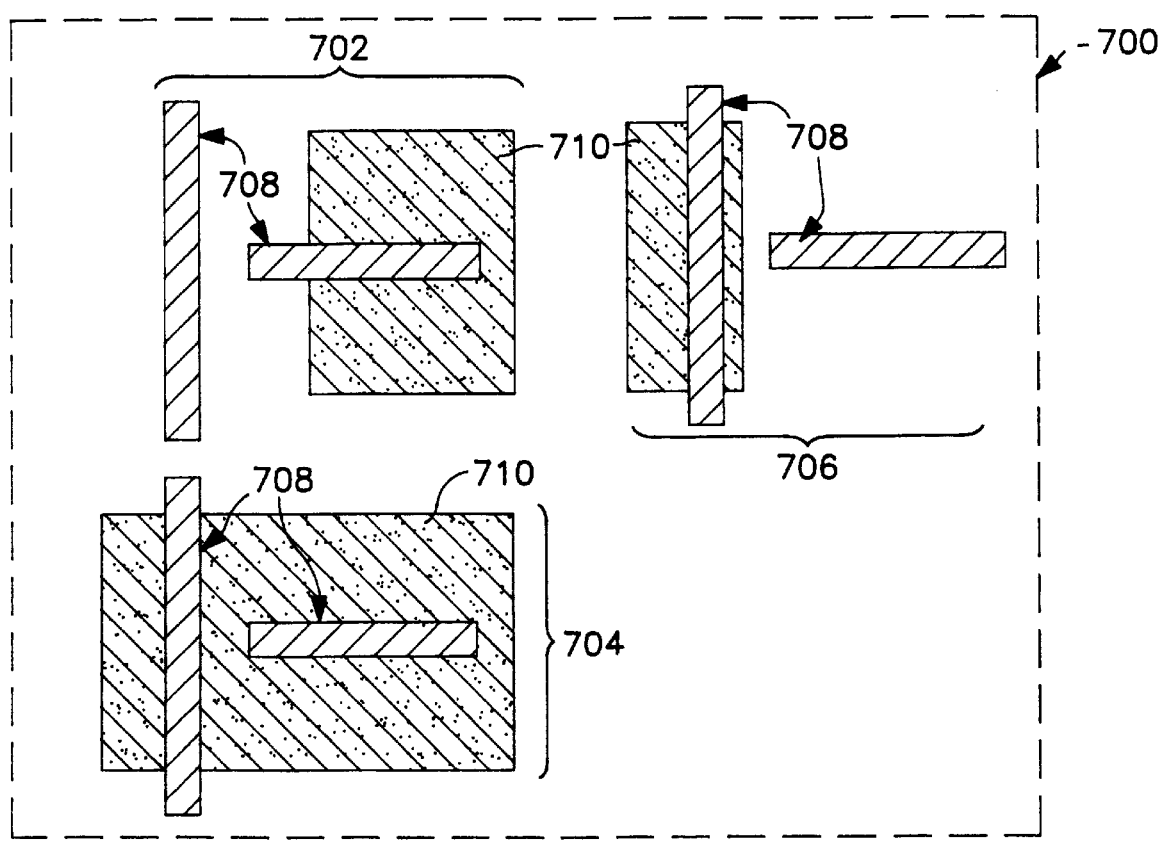
FIGS. 7A–7H and 8A–8D show plan views of partial VLSI circuit layouts using the various process steps of FIGS. 6A–6C to correct design rule violations.

Referring to FIG. 7A, a portion of an exemplary integrated circuit layout 700 is illustrated. In FIG. 7A, the layout 700 consists of regions 702, 704, and 706. Within each region are gate levels 708 and diffusion regions 710. The layout 700 may have any combination of critical and non-critical regions. These regions will be discussed below in detail. To implement the exemplary embodiment, both design rules and design constraints are necessary. In the following Figs. exemplary marker shapes and circuit shapes are used. It is understood that these shapes are merely exemplary for ease of illustration and presentation of the present inventive concept.

In the exemplary flow chart, the following exemplary design rules are assumed:

1) Any line segment with a line width of less than $W_{nc}$ is considered critical;

2) The distance between any two critical line ends should be greater than or equal to D, where D is a predefined distance.

3) Any non-critical width portion of a feature should have a length greater than or equal to L, where L is a predefined length.

4) Any portion of a gate level that intersects a diffusion region is a critical region.

In addition, the following exemplary design constraints are assumed:

a) Low cost—widen only non-critical portions of a gate level region;

b) Intermediate cost—widen only non-critical portions of gate level regions and move regions apart; and c) High cost—widen performance critical portions of gate level regions.

Referring to FIG. 6A, at Step 600 layout 700 (shown in FIG. 7A) is loaded into a marker shape generator (not shown). The marker shape generator creates marker indications for the operator to determine where design rule conflicts exist in layout 700. At Step 605, an initial design constraint is loaded into the marker shape generator for the first pass of layout 700 through the marker shape generator.

At Step 610, layout 700 is run through the marker shape generator. At Step 615, if marker shapes are detected, the process continues. If marker shapes are not detected, layout 700 conforms with all design rules for the design constraints loaded into the marker shape generator. The results of the first pass through layout 700 are shown in FIG. 7B.

Figure 7B:
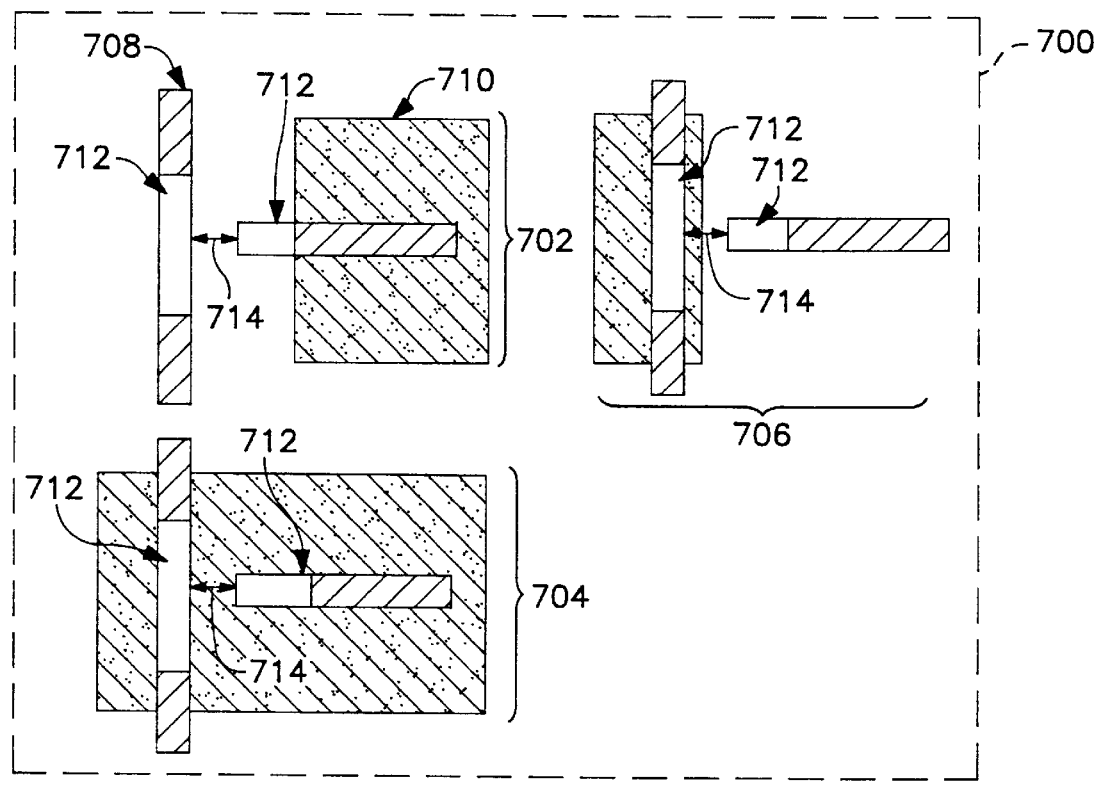

In FIG. 7B, width markers 712 are shown in regions 702, 704, and 706 where design violations exist. In this case, distance 714 violates Rule 2 mentioned above. To correct this violation, the width of region 702, 704 and 706 in the area indicated by width marker 712 needs to be widened or the distance 714 between gate levels 708 increased to become non-critical. In the exemplary embodiment, width markers are addressed first followed by distance markers if necessary. It is understood that given a different cost structure it is also possible to address distance markers first followed by width markers.

Figure 7C:
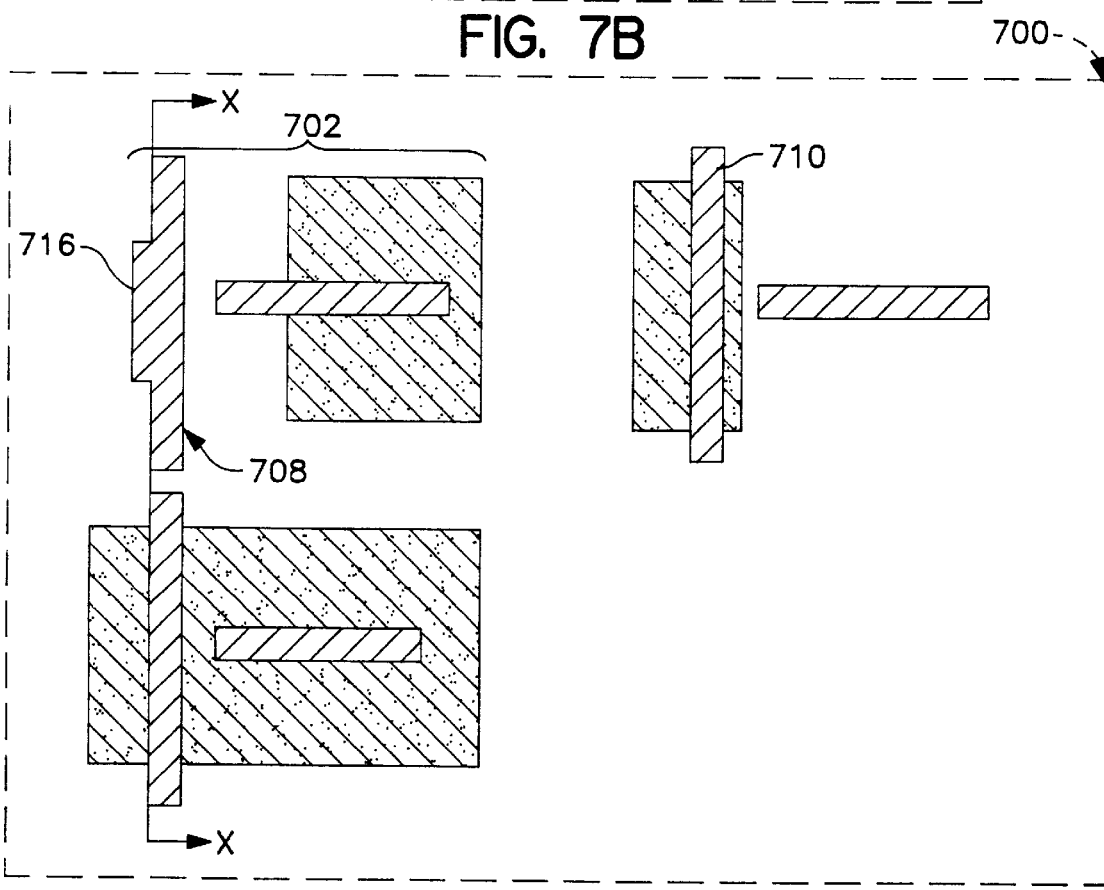

At Step 620, a layout modification system (not shown) is run along the X-axis (indicated as X—X in FIG. 7C) of layout 700 to correct width markers 712 if possible. The results of modifying layout 700 based on the initial constraints, for width markers 712, are shown in FIG. 7C as an increase in width over a portion 716 of gate level 708. This first pass has now corrected the low-cost design violation of layout 700 in the X-direction for certain width markers 712. Regions 704 and 706 are not corrected since the marker is over a diffusion region which is a critical area (Rule 4).

At Step 625, layout 700 is once again run through the marker shape generator. At Step 635, if marker shapes are detected, the process continues. If marker shapes are not detected, layout 700 now conforms with all design rules for the design constraints loaded into the marker shape generator. The results of the second pass through are shown in FIG. 7D.

Figure 7D:
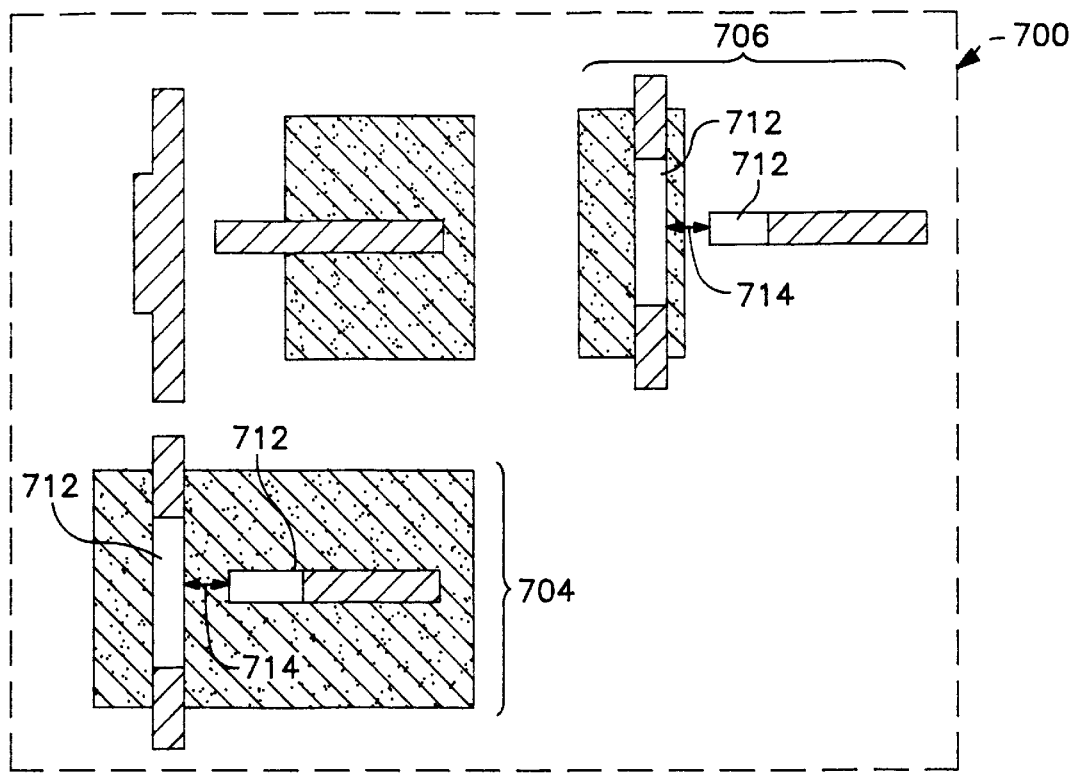

In FIG. 7D, marker shapes 712 are shown in regions 704 and 706 where design violations still exist. In this case, distance 714 violates Rule 2 mentioned above. To correct this violation, the width of region 704 and 706 in the area indicated by marker shape 712 needs to be widened to become non-critical.

Figure 7E:
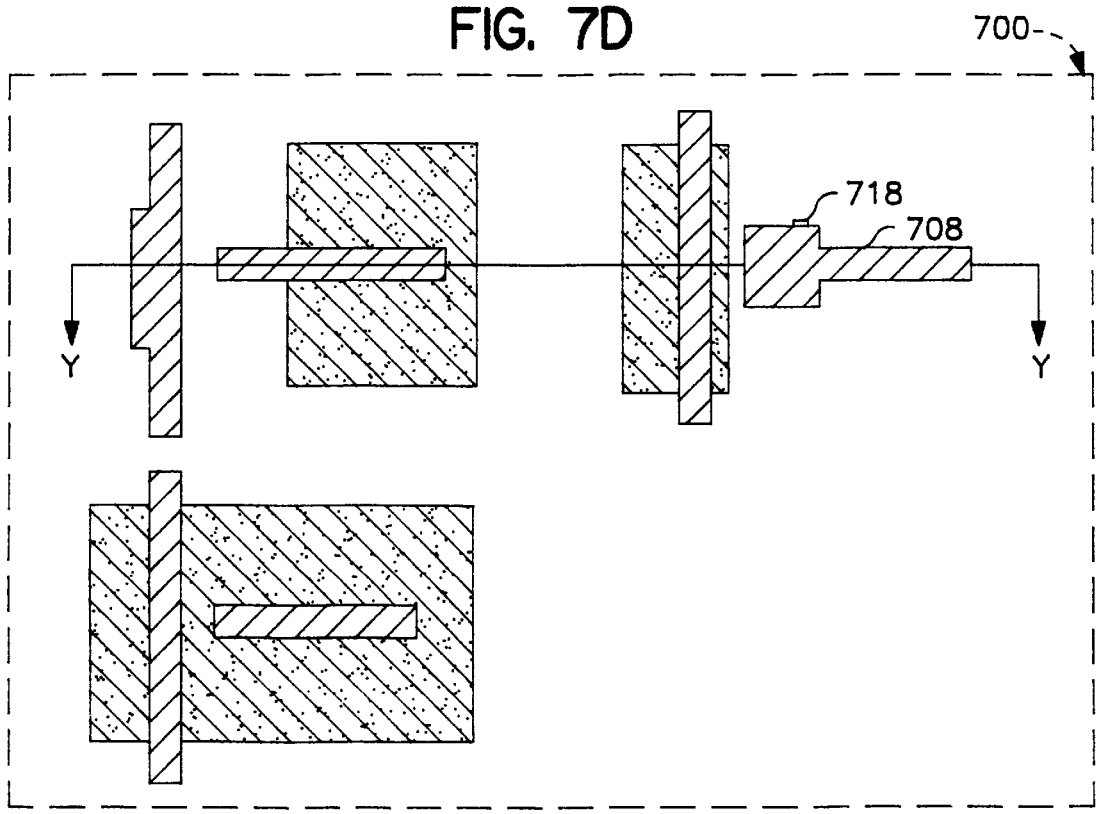

At Step 640, the layout modification system is run along the Y-axis (indicated as Y—Y in FIG. 7E) of layout 700 to correct width markers 712 if possible. The results of modifying layout 700 based on the initial constraints are shown in FIG. 7E as an increase in width over a portion 718 of gate level 708. This second pass has now corrected the low cost design violation of layout 700 in the Y-direction with respect to certain width markers 712. As shown in FIG. 7E, region 704 is not corrected (rule 4).

At Step 645, layout 700 is run through the marker shape generator for a third time. At Step 650, if marker shapes are detected, the process continues. If marker shapes are not detected, layout 700 now conforms with all design rules for the design constraints loaded into the marker shape generator. The results of the third pass through are shown in FIG. 7F.

Figure 7F:
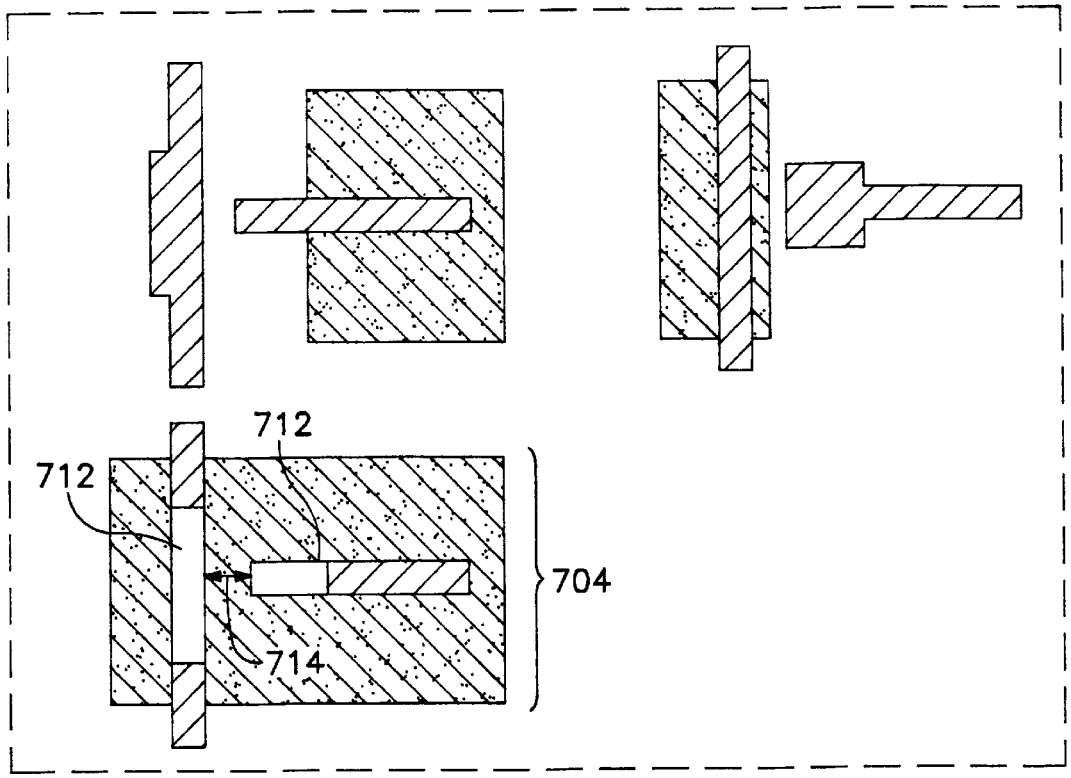

In FIG. 7F, marker shapes 712 are shown in region 704 where design violations still exist. In this case, distance 714 violates Rule 2 mentioned above. To correct this violation, the width of region 704 in the area indicated by marker shape 712 needs to be widened to become non-critical or distance 714 increased to become non-critical.

Since both x and y axis have been processed to the lowest cost design constraint, no further corrections are possible at this cost level.

At Step 660, the cost level is incremented to now allow the exemplary intermediate cost corrections. At Step 670, the new cost limit is checked and if it does not exceed a predetermined limit, the process continues at 620, otherwise the process is terminated with an error at Step 675.

Figure 7G:
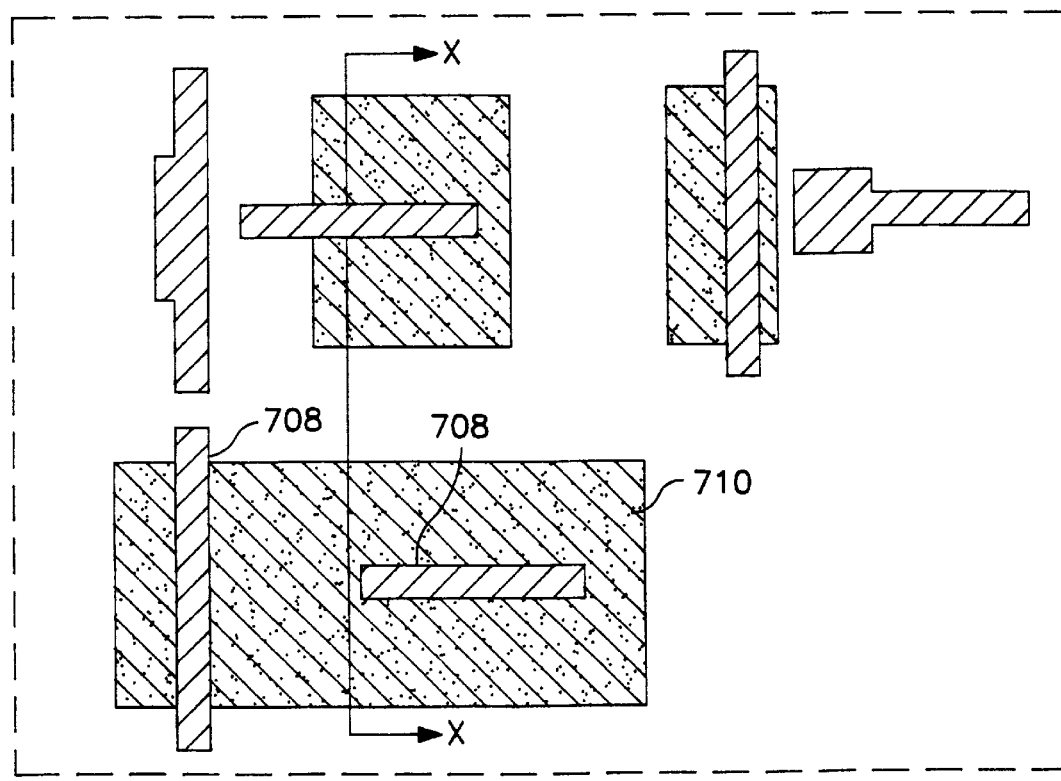

At Step 620, the layout modification system is run along the X-axis (indicated as X—X in FIG. 7G) of layout 700 to correct distance marker 714 if possible. The results of modifying layout 700 based on the initial constraints are shown in FIG. 7G as an increased spacing between gate levels 708 associated with diffusion region 710. This third pass has now corrected the intermediate cost design violation of layout 700 in the X-direction with respect to certain distance markers 714. This results in diffusion region 710 being widened (layout modification system).

Figure 7H:
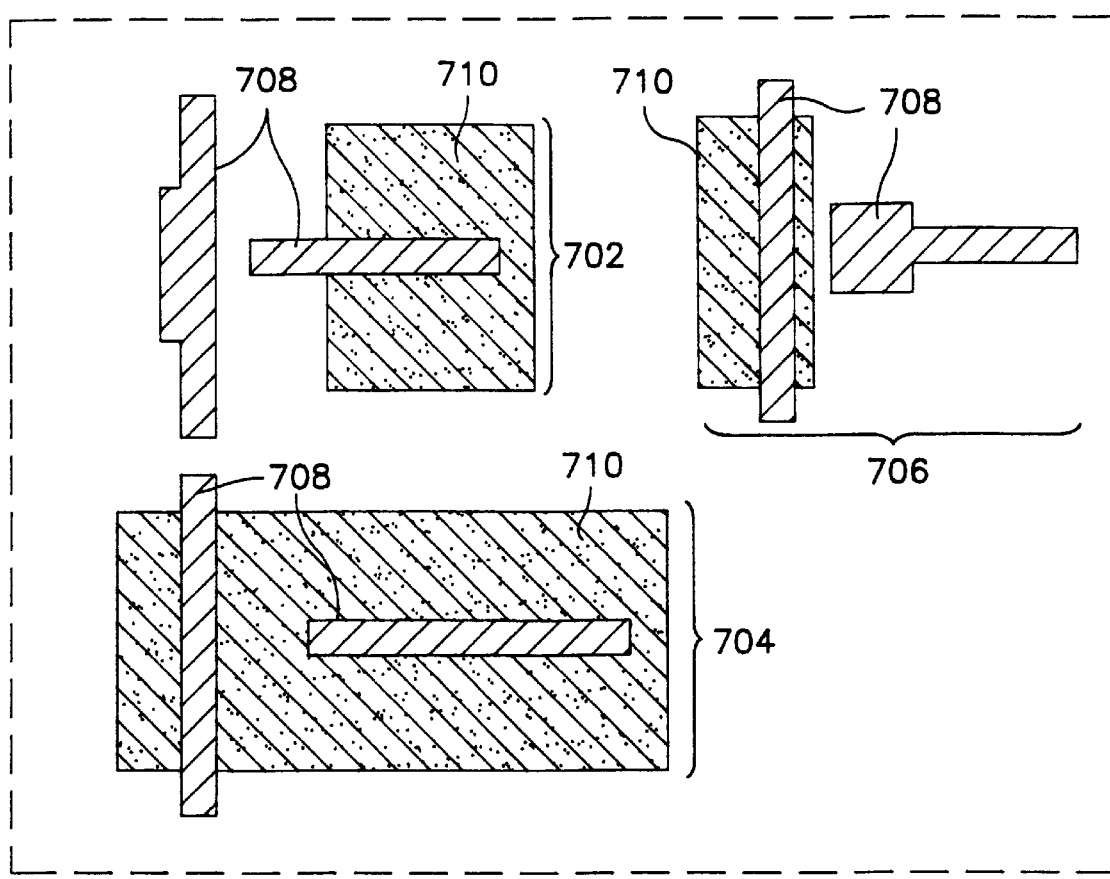

The results of the above series of steps is shown in FIG. 7H. In FIG. 7H, a complete conversion of the design of FIG. 7A is shown with all design rule violations corrected. Although at this point the correction of exemplary design layout 700 is complete, further steps may be needed for more complex designs following the concept outlined above.

In the above example, only two design levels, the poly conductor (gate) and the diffusion region are addressed. It is understood, by those skilled in the art, that typical circuit layouts may comprise 20 or more design levels that contain shapes which are governed by intra-level design rules as well as inter-level design rules. It is also understood that no single level may be manipulated or modified without determining the effects this manipulation may have on the other design levels. For example, referring again to FIG. 7H, in region 704, where the two gate structures are moved apart to increase space 714, the diffusion region is widened to maintain original overlap design rules.

Figure 8A:
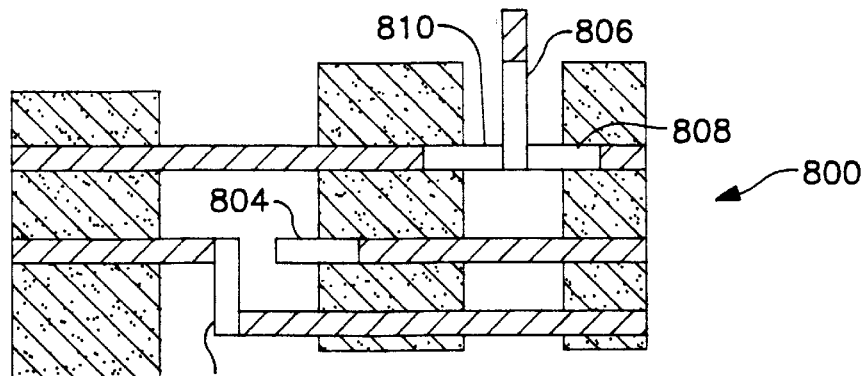

FIGS. 8A–8D illustrate the PSM migration where multiple design constraints are used. In FIG. 8A, layout 800 is run through the marker shape generator and marker shapes 802, 804, 806, 808, 810 are indicated where design rule violations exist.

Figure 8B:
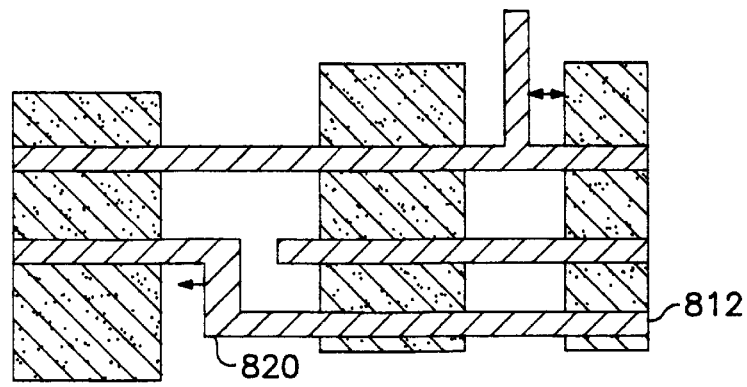

In FIG. 8B, the design is modified using the initial design constraint and the layout modification system according to Steps 615 through 670. In this example, by increasing the width 820 of gate level 812 the design conflicts highlighted by marker shapes 802 and 804 are corrected. This first pass through, however, did not correct all of the design violations. Therefore, Steps 675 through 690 are executed to increment the design constraint and the process is initiated again at Step 610.

Figure 8C:
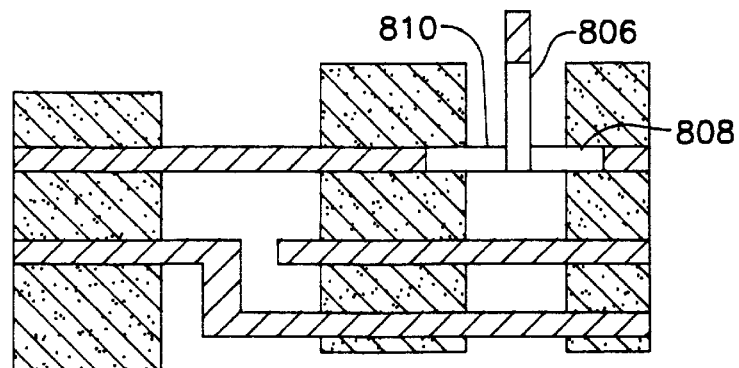
Figure 8D:
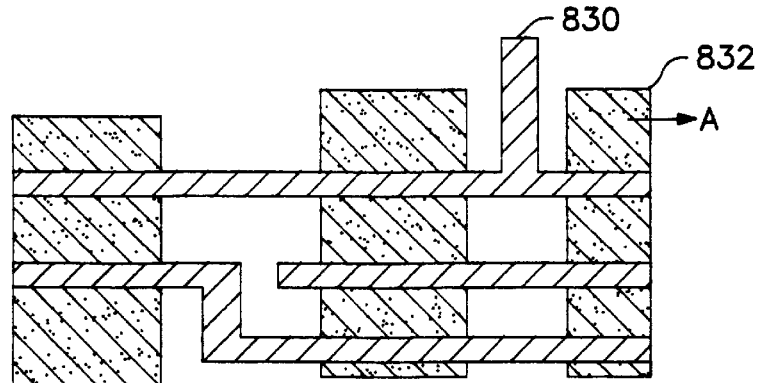

FIG. 8C illustrates the second pass through of the process. In FIG. 8C, marker shapes 806, 808, 810 are once again identified using the new design constraint. In FIG. 8D, the design is modified using the layout modification system and the new design constraint according to Steps 615 through 670. In this example, by increasing the width of gate level 830 and moving diffusion region 832 in direction A to maintain the relative spacing between gate level 830 and diffusion region 832, the design conflicts highlighted by marker shapes 806, 808, and 810 are corrected. This second pass through corrected the remaining design violations.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for converting an integrated circuit design to a phase-shift compliant mask design, the method comprising the steps of:

(a) locating features of the integrated circuit that violate predetermined design criteria;

(b) modifying the features located in Step (a) based on a predetermined cost constraint;

(c) determining if the Step (b) corrected all violations determined in the Step (a), changing the cost constraint to a further cost constraint if violations still exist and terminating the conversion if the violations are corrected; and (d) repeating steps (b) and (c).

2. A method for optimizing an integrated circuit design comprising the steps of:

(a) loading a layout of the integrated circuit into a shape generator;

(b) initializing design constraints in the shape generator;

(c) determining if the layout violates the design constraints;

(d) modifying the layout based on the result of Step (c); and (e) repeating Steps (c) and (d) until Step (c) determines that the layout does not violate the design constraints, wherein the design constraint is based upon a cost constraint.

3. The method according to claim 2, wherein the Step (c) comprises the further step of (c1) generating marker shapes to indicate a violation.

4. The method according to claim 3, wherein the marker shapes indicate at least one of a location of a conflict and a spatial extent of the conflict.

5. The method according to claim 3, wherein the marker shapes are at least one of:

i) error vectors indicating violations of phase shiftability design rules in the original design;

ii) error vectors based on phase conflicts; and iii) error vectors based on design violations in the phase shapes created.

6. The method according to claim 3, wherein the Step (c1) comprises the further step of (c2) terminating the optimization if Step (c) determines that a violation does not exist.

7. The method according to claim 3, wherein the cost constraint is at least one of:

i) expanding the marker shapes;

ii) moving the marker shapes within an original size of the design;

iii) expanding the marker shapes within an original size of the design;

iv) moving the marker shapes within predefined areas of the design without increasing the size of the design;

v) expanding the marker shapes within predefined areas of the design without increasing the size of the design;

vi) moving the marker shapes within predefined areas of the design and increasing the size of the design within a predetermined percentage; and vii) expanding the marker shapes within predefined areas of the design and increasing the size of the design within a predetermined percentage.

8. The method according to claim 2, wherein the Step (d) comprises the steps of:
(d1) modifying the layout in a first direction; and
(d2) modifying the layout in a second direction.

9. The method according to claim 8, wherein the second direction is orthogonal to the first direction.

10. The method according to claim 2, wherein the Step (d) modifies the design with respect to a width of a design feature of the integrated circuit.

11. The method according to claim 2, wherein the Step (d) modifies the design with respect to a distance between design features of the integrated circuit.

12. The method according to claim 1, wherein the Step (a) comprises the further step of (a1) generating marker shapes to indicate the violation.

13. The method according to claim 12, wherein the marker shapes indicate at least one of a location of a conflict and a spatial extent of the conflict.

14. The method according to claim 12, wherein the marker shapes are at least one of:
  i) error vectors indicating violations of phase shiftability design rules in the original design;
  ii) error vectors based on phase conflicts; and
  iii) error vectors based on design violations in the phase shapes created.

15. The method according to claim 12, wherein the Step (a1) comprises the further step of (a2) terminating the optimization if Step (a) determines that a violation does not exist.

16. The method according to claim 12, wherein the cost constraint is at least one of:
  i) expanding the marker shapes;
  ii) moving the marker shapes within an original size of the design;
  iii) expanding the marker shapes within an original size of the design;
  iv) moving the marker shapes within predefined areas of the design without increasing the size of the design;
  v) expanding the marker shapes within predefined areas of the design without increasing the size of the design;
  vi) moving the marker shapes within predefined areas of the design and increasing the size of the design within a predetermined percentage; and
  vii) expanding the marker shapes within predefined areas of the design and increasing the size of the design within a predetermined percentage.

17. The method according to claim 1, wherein the Step (b) comprises the steps of:
(b1) modifying the design in a first direction; and
(b2) modifying the design in a second direction.

18. The method according to claim 16, wherein the second direction is orthogonal to the first direction.

19. The method according to claim 1, wherein the Step (b) modifies the features with respect to a width of a design feature of the integrated circuit.

20. The method according to claim 1, wherein the Step (b) modifies the features with respect to a distance between design features of the integrated circuit.

* * * * *

UNITED STATES PATENT AND TRADEMARK OFFICE
CERTIFICATE OF CORRECTION

PATENT NO. : 6,083,275
DATED : July 4, 2000
INVENTOR(S) : Heng et al.

It is certified that error appears in the above-identified patent and that said Letters Patent is hereby corrected as shown below:

In the Abstract, "complaint" should be --compliant--;

At column 5, line 60, "complaint" should be --compliant--;

At column 6, line 37, "6A-6C" should be --6A-6B--;

At column 6, line 44, "complaint" should be --compliant--;

At column 8, line 55, "At" should be --Referring to Fig. 6B, at--;

In claim 7, at column 10, line 53, "within" should be --without increasing--;

In claim 7, at column 10, line 55, "an" should be --the--;

In claim 18, at column 10, line 53, "according to claim 16" should be --according to claim 17--.

Signed and Sealed this

Fifteenth Day of May, 2001

Attest:

NICHOLAS P. GODICI

Attesting Officer     Acting Director of the United States Patent and Trademark Office